(12) United States Patent
Sudo et al.

(10) Patent No.: US 6,400,601 B1
(45) Date of Patent: Jun. 4, 2002

(54) NONVOLATILE SEMICONDUCTOR MEMORY DEVICE

(75) Inventors: Naoaki Sudo, Tokyo; Satoshi Katagiri, Kawasaki, both of (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/602,178

(22) Filed: Jun. 22, 2000

(30) Foreign Application Priority Data

Jun. 30, 1999 (JP) .......................................... 11-186711

(51) Int. Cl.$^7$ .............................................. G11C 16/04
(52) U.S. Cl. .............................. 365/185.03; 365/185.24
(58) Field of Search ........................ 365/185.03, 185.22, 365/185.24, 185.29

(56) References Cited

U.S. PATENT DOCUMENTS

| | | | | |
|---|---|---|---|---|
| 5,930,172 A | * | 7/1999 | Kucera .................. | 365/185.03 |
| 6,138,148 A | * | 10/2000 | Kawahara et al. ..... | 365/185.03 |
| 6,181,603 B1 | * | 1/2001 | Jyouno et al. ......... | 365/185.03 |
| 6,191,977 B1 | * | 2/2001 | Lee ....................... | 365/185.03 |
| 6,195,284 B1 | * | 2/2001 | Egawa .................. | 365/185.03 |

* cited by examiner

Primary Examiner—Trong Phan
(74) Attorney, Agent, or Firm—Katten Muchin Zavis Rosenman

(57) ABSTRACT

A nonvolatile semiconductor device is provided, which does not need excessive writing or verification operations, except for the originally required writing and verification operations. The data is arranged in the order from the lowest "11", "10", "01", to the highest "01". Four valued writing data are set in the latches 1 and 2 by data signals DL1 and DL2, and the latch 3 is initialized to "0". Writing is executed by three stages, and before writing at each stage, if the latch 3 is "0", the data is transferred to the latch 2. Writing is only executed when any one latch is "0", and the latch is changed to "1" after the verification is completed. First, writing is executed up to the threshold value of the data "01", except the data "11" where the latch 2 is "0". Next, writing is executed for the data "00" and "01" up to the threshold value of the data "00", where the latch 1 is "0". Finally, the data "01" where the latch 2 is "0" is written up to the threshold value of "01".

6 Claims, 17 Drawing Sheets

FIG.3

| write data | | | 1 | | | 1 | | | 0 | | | 0 | | | 1 | |
|---|---|---|---|---|---|---|---|---|---|---|---|---|---|---|---|---|---|
| | LATCH1 (A) | LATCH2 (C) | LATCH3 (E) | LATCH1 (A) | LATCH2 (C) | LATCH3 (E) | LATCH1 (A) | LATCH2 (C) | LATCH3 (E) | LATCH1 (A) | LATCH2 (C) | LATCH3 (E) | LATCH1 (A) | LATCH2 (C) | LATCH3 (E) |
| INITIAL VALUE | 1 | 1 | 1 | 1 | 1 | 1 | 0 | 0 | 1 | 0 | 0 | 1 | 0 | 1 | 0 |
| RESETTING OF LATCH2*1 | PROHIBIT WRITING | | | 1 | 1 | 1 | 0 | 0 | 1 | 0 | 0 | 1 | 0 | 1 | 0 |
| Write1 | | | | 1 | 1 | 1 | 0 | [0] | 1 | 0 | 0 | 1 | 0 | 0 | 0 |
| Verify1 | | | | 1 | 1 | 1 | 0 | [1] | 1 | 0 | 0 | 1 | 0 | 0 | 0 |
| | | | | COMPLETE WRITING | | | | | | | | | | | |
| RESETTING OF LATCH2*1 | | | | 1 | 1 | 1 | 0 | 1 | 1 | 0 | 1 | 1 | 0 | 0 | 0 |
| Write2 | | | | 1 | 1 | 1 | [0] | 1 | 1 | [0] | 1 | 1 | 0 | 0 | 0 |
| Verify2 | | | | 1 | 1 | 1 | [1] | 1 | 1 | [1] | 1 | 1 | 0 | 0 | 0 |
| | | | | | | | COMPLETE WRITING | | | | | | | | |
| RESETTING OF LATCH2*1 | | | | 1 | 1 | 1 | 1 | 1 | 1 | 1 | 1 | 1 | 1 | 0 | 0 |
| Write3 | | | | 1 | 1 | 1 | 1 | 1 | 1 | 1 | 1 | 1 | 1 | [0] | 0 |
| Verify3 | | | | 1 | 1 | 1 | 1 | 1 | 1 | 1 | 1 | 1 | 1 | [1] | 0 |
| | | | | | | | | | | | | | COMPLETE WRITING | | |

SET LATCH2 TO "0" ONLY WHEN LATCH3="0"

FIG.6

| | (1, 1) | (1, 0) | (0, 0) | (0, 1) | HIGHER RANK | LOWER RANK |
|---|---|---|---|---|---|---|
| STATE 1 | ∩ | | | | 1 | 1 |
| STATE 2 | ⇢ | ∩ | | | 1 | 0 |
| STATE 3 | ⇢ | ∩ | | | 0 | 0 |
| STATE 4 | ⇢ | ∩ | | | 0 | 1 |
| | Vtm1 | Vtm2 | Vtm3 | | | |

LOW ⟶ HIGH

FIG.7

| | (1, 1) | (1, 0) | (0, 0) | (0, 1) | HIGHER RANK | LOWER RANK |
|---|---|---|---|---|---|---|
| STATE 1 | ∩ | | | | 1 | 1 |
| STATE 2 | | ∩ | | | 1 | 0 |
| STATE 3 | | ⇢ | ∩ | | 0 | 0 |
| STATE 4 | | ⇢ | ∩ | | 0 | 1 |
| | Vtm1 | Vtm2 | Vtm3 | | | |

LOW ⟶ HIGH

FIG.8

| | (1, 1) | (1, 0) | (0, 0) | (0, 1) | HIGHER RANK | LOWER RANK |
|---|---|---|---|---|---|---|
| STATE 1 | ∩ | | | | 1 | 1 |
| STATE 2 | | ∩ | | | 1 | 0 |
| STATE 3 | | | ∩ | | 0 | 0 |
| STATE 4 | | | (∩)→ | ∩ | 0 | 1 |
| | Vtm1 | Vtm2 | Vtm3 | | | |

LOW ⟶ HIGH

FIG.10

| read data | 1 | 1 | 1 | 0 | 0 | 0 | 0 | 1 |
|---|---|---|---|---|---|---|---|---|
| | LATCH1 (A) | LATCH2 (C) | LATCH1 (A) | LATCH2 (C) | LATCH1 (A) | LATCH2 (C) | LATCH1 (A) | LATCH2 (C) |
| READ3T | — | 1 | — | 1 | — | 1 | — | 1 |
| READVT | 1 | 1 | 1 | 1 | 1 | 1 | 1 | 1 |
| READ1T | 1 | 1 | 1 | [0] | 1 | [0] | 1 | [0] |
| READ2T | 1 | 1 | 1 | 0 | [0] | 0 | [0] | 0 |
| READ3T | 1 | 1 | 1 | 0 | 0 | 0 | 0 | [1] |

FIG.14  PRIOR ART

| | (1, 1) | (1, 0) | (0, 1) | (0, 0) | MSB | LSB |
|---|---|---|---|---|---|---|
| STATE 1 | ∩ | | | | 1 | 1 |
| STATE 2 | | ∩ | | | 1 | 0 |
| STATE 3 | | | ∩ | | 0 | 1 |
| STATE 4 | | | | ∩ | 0 | 0 |
| | $V_{REF1}$ | $V_{REF2}$ | $V_{REF3}$ | | | |

LOW ──────────▶ HIGH

FIG. 15 PRIOR ART

| write data | 1 | 1 | 1 | 1 | 0 | 0 | 0 | 0 |
|---|---|---|---|---|---|---|---|---|
| Write1 | [1] | 1 | 1 | [1] | 0 | [0] | [0] | 0 |
| Verify1 | 1 | 1 | 1 | 1 | 0 | 1 | 1 | 0 |
| LOWER RANK BIT → HIGHER RANK BIT | 1 | 1 | 1 | 0 | 0 | 1 | 1 | 0 |
| READING MEMORY CELL IF THRESHOLD VALUE OF MEMORY CELL≧Vref2, "1" → LOWER RANK BIT | 1 | 1 | [1] | 0 | [0] | 1 | 1 | 1 |
| Write2 | 1 | [1] | 1 | 0 | 1 | 1 | [1] | [1] |
| Verify2 | 1 | 1 | 1 | 0 | 1 | 1 | 1 | 1 |
| READING MEMORY CELL IF THRESHOLD VALUE OF MEMORY CELL≧Vref2, "1" → LOWER RANK BIT | 1 | 1 | 1 | 0 | 1 | 0 | 1 | 1 |
| IF HIGHER RANK BIT IS "1" "1" → LOWER RANK BIT | 1 | 1 | 1 | 0 | 1 | 0 | 1 | 1 |
| Write3 | 1 | [1] | [1] | 0 | [1] | 0 | [1] | [0] |
| Verify3 | 1 | 1 | 1 | 0 | 1 | 0 | 1 | 1 |

FIG.16 PRIOR ART

| | (1, 1) | (1, 0) | (0, 1) | (0, 0) | MSB | LSB |
|---|---|---|---|---|---|---|
| STATE 1 | ∩ | | | | 1 | 1 |
| STATE 2 | ∩ | | | | 1 | 0 |
| STATE 3 | | | ∩ | | 0 | 1 |
| STATE 4 | | | ∩ | | 0 | 0 |
| | $V_{REF1}$ | $V_{REF2}$ | $V_{REF3}$ | | | |

LOW ⟶ HIGH

FIG.17 PRIOR ART

| | (1, 1) | (1, 0) | (0, 1) | (0, 0) | MSB | LSB |
|---|---|---|---|---|---|---|
| STATE 1 | ∩ | | | | 1 | 1 |
| STATE 2 | (⌒)→ | ∩ | | | 1 | 0 |
| STATE 3 | | | ∩ | | 0 | 1 |
| STATE 4 | | | ∩ | | 0 | 0 |
| | $V_{REF1}$ | $V_{REF2}$ | $V_{REF3}$ | | | |

LOW ⟶ HIGH

FIG.18 PRIOR ART

| | (1, 1) | (1, 0) | (0, 1) | (0, 0) | MSB | LSB |
|---|---|---|---|---|---|---|
| STATE 1 | ∩ | | | | 1 | 1 |
| STATE 2 | | ∩ | | | 1 | 0 |
| STATE 3 | | | ∩ | | 0 | 1 |
| STATE 4 | | | (⌒)→ | ∩ | 0 | 0 |
| | $V_{REF1}$ | $V_{REF2}$ | $V_{REF3}$ | | | |

LOW ⟶ HIGH

NONVOLATILE SEMICONDUCTOR MEMORY DEVICE

BACKGROUND OF THE INVENTION

1. Field of the Invention

The present invention relates to a nonvolatile semiconductor memory device having electrically rewritable nonvolatile memory cells, and particularly relates to a multi-valued nonvolatile semiconductor memory device which is capable of storing information corresponding to a plurality of bits per a memory cells.

2. Background Art

EPROMs (Erasable Programmable Read Only Memory) or EEPROMs (Electrically Erasable PROM) have been used as nonvolatile semiconductor memory devices capable of being electrically written into memory cells in the past. However, the recent mainstream tends toward flash memories because of the capability of collective erasure of a erasure block defined as block units in a memory cell array. In a flash memory device, a memory cell comprises a source, a drain, and a floating gate, and a control gate laminated on each other through insulating films. Writing and erasing operations are executed by injection and extraction of electrons for the floating gate using the hot electron effect or the tunneling effect and the writing operation can also be executed utilizing a phenomenon that the threshold value of the memory cell changes with or without electron injection.

Now, there are a few types of memory cells in a flash memory device because of the thickness variation or the inclusion of minute defects in oxide films due to dispersion of manufacturing process. One type of the memory cell is that necessary to write repeatedly because writing is difficult, and another one is, in contrast to the above type, that necessary to complete writing in a short time so as to prevent overwriting. In other words, when writing is executed to all memory cells by an identical condition, the threshold values for those memory cells become diverse so that margins for the operating voltage or the access time become not adjustable.

In order to cope with the above circumstance, the writing operation to the memory cells in the flash memory devices are executed not by one time but by a plurality of times while adjusting writing pulse widths or writing voltages, and always determining a degree of writing until the desired level of the threshold value is attained. This is because, if too many electrons are injected in the floating gate, then, except by executing an erasing operation, it is difficult to restore the gate and that it is possible to erase the flash memory cell only when a collective erasure of a total memory cells or a block unit of the memory cells is carried out, in contrast to the EEPROM, in which the memory cells can be erased individually. The above-mentioned repetitive writing operations allows overcoming the diverse threshold values of the memory cells and it is necessary to recognize the diverse distribution of the threshold values. In fact, the threshold values of all memory cells in a memory cell array are distributed as shown in FIG. 14, described later.

In order to reduce the chip size while increasing the memory volume of the memory cells, the memory cells are now changing to store multi-valued data are more than the binary data. For that purpose, the memory cells that can store the multi-valued data is realized by setting the multilevel threshold values or threshold voltages (multilevel cells) in accordance with the data by controlling the amount of electron injected into the floating gate. When each memory cell is made into a multilevel cell, for example, a four valued cell, each memory can store the data corresponding to two bits. When four valued cells are used, the number of memory cells for a flash memory, which originally includes 512 million binary cells can be reduced to 256 million binary cells, which results in reducing the chip area for the memory cells.

Japanese Unexamined Patent Application, First Publication No. Hei 8-315586 discloses a flash memory, the schematic structure of which is shown in FIG. 12. In the flash memory 100 shown in FIG. 12, a plurality of memory cells 101 are arranged in a matrix form. A plurality of word lines extending in the row direction of the cell matrix are connected with a plurality of control gates corresponding to respective word lines. A plurality of bit lines extending in the column direction of the cell matrix are connected to drains of a plurality of memory cells corresponding to respective word lines. The sources of respective memory cells are connected with a common source line (not shown). The row decoder 102 selects one of word lines according to an address signal externally input from the flash memory through an I/O buffer 103. The I/O buffer 103 is a circuit which forms an interface between the flash memory 100 and the outside.

A combination sense circuit and writing data latch 104 comprises sense amplifiers (not shown) and writing amplifiers (not shown) so as to correspond to each bit line, and one end of the writing data latch 104 is connected to the bit line of the memory cell array 101, and the other end is connected to the I/O buffer 103 through a column gate 105. A column decoder 106 controls a column switch constituting the column gate 105 according to the above-mentioned address signal for selecting a bit line designated by the address signal and corresponding to the combination sense circuit and writing data latch 104. A boosting circuit 107 generates various voltages (for example, high voltages necessary for writing and erasing the memory cell array 101) for supplying these voltages to the flash memory 100. A control circuit 108 sends various control signals to various portions of the flash memory 100 for controlling respective portions and making them execute writing and erasing operations.

FIG. 13 shows a detailed structure of a combination sense circuit and writing data latch 104 provided corresponding to one bit line among the sense circuits and writing data latches 104 shown in FIG. 12. In this conventional example, the flash memory is assumed to be constituted by memory cells which store two bits data (four level data). In this conventional example, when 2-bit data is written in the memory cell, the threshold value corresponding to the data "11" is the lowest, and the threshold values increases in the order of "10", "01", and "00". It is assumed that 2-bit data from "11" to "00" (in FIG. 14, MSB is the higher rank bit, and LSB is the lower rank bit) are in the states from the "state 1" to the "state 4", and that differences of the threshold values separating adjacent threshold values are VREF1 to VREF3. Here, "the state 1" is the state after erasure.

In FIG. 13, both reference symbols MSEN and LSEN denote sense amplifiers and both amplifiers are provided with respective latches 110 and 111 constituted by two inverters connected like a loop. The latch 110 stores the higher rank bit and the latch 111 stores the lower rank bit among two bits data. FIG. 15 is a diagram for explaining the writing operation executed by the circuit shown in FIG. 13. FIG. 15 shows a time serial change of data stored in respective latches 110 and 111 for each of the 2-bit data for writing in the memory cells.

Here, the conventional writing operation into the memory cell will be described with reference to FIGS. 13 to 18. The details of the circuit shown in FIG. 13 will not be described, but the operation as a whole will be explained. At first, the threshold value of the memory cell is changed to the value corresponding to the "state 1". Since the writing data are divided into respective two bits (each "write data" in FIG. 15) in the course of delivering the writing data into the column gate 105 externally from the flash memory 100 (FIG. 12) through the I/O buffer 103, the latches 110 and 111 (FIG. 13) uptake writing data respectively through the data lines IO and IOB.

As shown below, the writing operation is performed by three stages, and the final writing state is attained by the writing operations executing respective stages shown in FIG. 16→FIG. 17→FIG. 18. In the first stage, based on the upper rank bit uptaken in the latch 110, writing into the memory cell is executed until reaching the VREF 2 corresponding to the "state 3" wherein the upper rank bit of the writing data is "0" ("01" and "00") ("write 1" in FIG. 15). As described above, since the threshold values for memory cells disperse even if an identical writing condition is applied to each memory cell, the memory cells subjected to writing do not necessarily reached the threshold value of VREF2. Thus, it becomes necessary to verify (hereinafter, called verification) whether or not the threshold values of respective cells reach VREF2.

Since it is possible to verify whether or not the threshold value of each cell reaches VREF2 by applying the potential of VREF2 to the control gate of each memory cell, the writing operation to the memory cells is considered to be completed by rewriting the higher rank bit into "1" for the memory cells having threshold values exceeding VREF2. In contrast, the higher rank bits for the memory cells having threshold values less than VREF2 are left unchanged at "0", and even if there is a memory cell in which the threshold value is less than VREF2, and even if there is a memory cell in which the higher rank bit is still "0", further writing and verification are executed. By repeating the above series of operations, practical writing goes forward for memory cells to be written. Finally, threshold values of every memory cell with writing data of "01" or "00" increases up to VREF 2, and the higher rank bits for every memory cells are turned into "1" (Verify 1 in FIG. 15 and FIG. 16).

Next, the following processing is executed prior to the second stage writing operation. First, the lower rank bits are transferred to the higher rank bits, so that the higher rank bits that change when the writing data is "10" or "11". Then, reading is executed by applying VREF2 to the control gates of the memory cells, and if the threshold value of a memory cell is higher than VREF2, "1" is added to the lower rank bit. As a result, the lower rank bits change when the writing data is "00". Similar to the writing operation in the first stage, writing is executed until the threshold value reaches VREF1 for the memory cell with the writing data of "10" (Write 2 in FIG. 15) and also a verification operation is executed for memory cells having threshold values of more than VREF1 for setting to "1". When threshold values of every memory cells exceed the value of VREF1, the second stage writing is completed (Verify 2 in FIG. 15 and FIG. 17).

Next, the following processing is executed prior to the third stage writing operation. First, similar to the second stage, the memory cell is read in order to set the low rank bits to "0" when the threshold value of the memory cell is less than VREF2. As a result, when the written data are "0" and "01", the lower rank bit changes. By successively setting the lower rank bit to "1" when the higher rank bit is "1", the lower rank bit changes when the written data in the lower rank bit is set to "1". Then, similar to the writing operation at the first and second stages, the writing operation is executed according to the stored data for memory cells having the writing data of "00" up to the threshold value of VREF3 (Write 3 in FIG. 15), which follows the verification operation for setting "1" for every bit having higher threshold values than VREF3. The writing and verification operations are repeated until threshold values of every memory cell exceed VREF3 (Verify 3 in FIG. 15).

As shown above, the conventional device is constructed such that the first stage writing operation is first executed using the higher rank bits, and the second and third stage writing operations determine the latched data used for the writing operation, after the state of the memory cells is read out each time writing occurs. Thus, in the conventional technique except for the verification purpose, an excess reading time is consumed, which makes the total time necessary for writing in the memory cells longer.

The reasons for requiring the above-described reading from the memory cell at the time of writing is as follows: when the flash memory uses the four valued memory cell, it is necessary to write three times to the three threshold levels corresponding to the three states of the memory cells excluding the state after the erasing operation. In order to carry out three time writing operations, the memory cells must be maintained at three respective states while confirming that the writing to a threshold state is completed. In the conventional device, therefore, the writing is executed in advance for memory cells having the upper rank bit of "0" up to the threshold value of VREF2, and the latch (latch 110 and 111) are provided only for two remaining states. In the end, one state among three states is stored by the memory cell and the latches (110 and 11) are provided only for other two states. However, at the stage when respective verification operations executed at respective writing operations are completed, the data stored in the latches used for judging whether the writing can be executed are destroyed. In order to proceed with the processing, it becomes necessary to refer to the data remaining in the latches 110 and 111 without being destroyed and the data remaining in the memory cells, which requires reading the memory cells.

From the point of view of the time for the writing operations, there is other useless time in the conventional device. As shown in FIG. 19, it is assumed that the "state 1" to the "state 4" shown in FIG. 14 are defined as "erasure level", "writing level 1", "writing level 2", and "writing level 3". In addition, as shown in FIG. 19, it is also assumed that the time required for changing the "erasure level" to the "writing level 1" is T1, the time for changing the "writing level 1" to the "writing level 2" is T2, and the time for changing the "writing level 2 to the "writing level 3" is T3.

As shown above, in the conventional technique, the overall writing operation is carried out first writing from the "erasure level (the state 1)" to the "writing level 1 (the state 2)", then from "the erasure level" to the "writing level 2 (the state 3)", and finally from the "erasure level" to the "writing level 3 (the state 4)". Thus, the total time for the overall writing operation becomes (T1+T2)+T1+T3=2*T1+T2+T3. If it is possible to raise the writing level from the "erasure level" to the "writing level 2" in sequence, then the total writing time can be reduced to T1+T2+T3. The conventional device, therefore, has a problem that it spends an excess time of T2 compared with the minimum time of T1+T2+T3.

Another problem arises in the above-described conventional writing processing. That is, since no further writing is executed for the memory cells of which the verification is completed, subsequent cases are caused in which, among memory cells connected with an identical word line, some memory cells are written and the other memory cells are not yet written. In such a case, a high voltage is also applied to every memory cell, which means that a high voltage also applied to the not written memory cells. Thereby, those memory cells are turned into a weakly written state. This weakly written state is called a "disturbed" state.

FIG. 20 shows the state in which two memory cells are disturbed. In the figure, two memory cells 150 and 151 are connected to a word line WL1, and the other two memory cells 152 and 153 are connected to another word line WL2. It is now assumed that writing is executed in the memory cell 150. In this case, the voltage applied to the word line WL1 to which the memory cell is connected is assumed to be "15 V", and the voltage applied to another word line WL2 is assumed to be "0 V". In addition, the voltage applied to the bit line BL1 connected with the memory cell 150 and 152 is assumed to be "0 V", and the voltage applied to the bit line BL2 connected with the not written memory cells 151 and 153 is assumed, for example, to be "5 V". Thus, "15 V" plus "5 V" are applied to the memory cell 151, and "5 V" is applied to the memory cell 153, both memory cells are turned into the disturbed state. Since the repeated occurrence of the disturbed state will degrade the reliability of each memory cell, so that it is preferable to prevent each memory cell from causing the disturbed state. However, in the conventional writing operation, the writing from the "erasure level" to the "writing level 1" is executed twice, which implies that the disturbed state occurs more frequently than the sequential writing operation from the "erasure level" to the "writing level 3". As a result, it is preferable not to execute the writing operation so frequently as the conventional operation.

Furthermore, in the conventional device, the threshold values for holding the memory cells at the time of the writing operation increases in the order from the lowest "11", "10", "01" to the highest "00". If the threshold values are reduced for some reasons such as the stress, the essential data "10" contained in the conventional rank appears as if it were "10", which causes two error bits, when viewed from the outside of the flash memory.

In general, one error bit can be corrected by a data correction circuit using an ECC (Error Correction Code), but it is difficult to correct two error bits by this data correction system. However, it becomes possible to correct two error bits by the addition of an extra redundancy bit to the normal redundancy bit for the ECC, which results in reducing the utilization efficiency of the ECC, and enlarging the circuit scale compared to the circuit for correcting one bit.

SUMMARY OF THE INVENTION

It is therefore an objective of the present invention to provide a nonvolatile semiconductor memory device, which nonly requires reading the essentially necessary writing and verification operations when writing the multi-valued data is carried out. It is also a further objective of the present invention to provide a nonvolatile semiconductor memory device, which, in writing multi-valued data, is capable of writing by the least number of times, and which does not cause degradation of reliability due to unnecessary occurrence of the disturbed state. It is also a still further objective of the present invention to provide a nonvolatile semiconductor memory device, which prevents generation of two error bits, even when the threshold of the memory cells storing multi-valued data is reduces.

In order to solve the above problems, according to the first aspect of the present invention, a nonvolatile semiconductor device is provided with a plurality of memory cells for storing more multi-valued data than binary data, comprising: a plurality of latches provided in the same number of the threshold values set for identifying each data of said multi-valued data stored in said memory cell; and a writing device for writing into said memory cells until reaching the threshold value corresponding to writing data, while setting and referring to the data stored in said plurality of latches corresponding to the given multi-valued writing data.

According to the second aspect of the present invention, in the nonvolatile semiconductor device according to the first aspect, each data of said multi-valued data which is identified by each of said threshold values is constructed by a gray code.

According to the third aspect, in the nonvolatile semiconductor device according to the first aspect, said latches comprise the three first to the third latches provided with the same numbers as three first to the third threshold values for identifying the four valued data represented by two bits, and said writing device executes the writing operation comprising the steps of: (1) setting initially said first and second latches with each bit of said writing data and initializing the said third latch to the writing permission data or the writing prohibition data in accordance with said writing data; (2) resetting said second latch to the writing permission data in advance, if the data stored in said third latch is the writing permission data, before respective writing stages for executing writing operations up to said first to said third threshold values; (3) setting the writing prohibition data in the second latch after writing data from the erasure level of the memory cell to said first threshold value when the data of the second latch is the writing permission data; (2) resetting said second latch to the writing permission data in advance, if the data stored in said third latch is the writing permission data, before respective writing stages for executing writing operations up to said first to said third threshold values; (3) setting the writing prohibition data in the second latch after writing data from the erasure level of the memory cell to said first threshold value when the data of the second latch is the writing permission data; (4) setting the writing prohibition data in said first latch after writing from the first threshold to the second threshold value when the writing permission data is latched in the first latch; and (5) setting the writing prohibition data in the second latch by writing from the second threshold value to the third threshold value when the writing permission data is written in said second latch.

According to the fourth aspect, in the nonvolatile semiconductor device according to the first aspect, said writing device executes the writing operation from the threshold value closest to the erasure level of the memory cells at the time of erasing said memory cells towards the remotest threshold values in sequence.

According to the fifth aspect, in the nonvolatile semiconductor device according to the first aspect, said plurality of latches and said writing device are provided in the circuit comprising a sense amplifier and a writing amplifier.

According to the sixth aspect, in the nonvolatile semiconductor device according to the first aspect, wherein, among said plurality of latches, the data read from said memory cells is absorbed in the latch in which said writing data is initially set at the time of writing in said memory cells.

According to the seventh aspect, in the nonvolatile semiconductor device according to the first aspect, wherein the writing device executes a verification operation for verifying whether or not the threshold value to be written is reached each time of the writing operation, and after repeating the writing operation and the verification operation until the threshold value is reached, setting the writing prohibition data in either one of latches used for the writing operation or the verification operation.

BRIEF DESCRIPTION OF THE DRAWINGS

FIG. 3 is a diagram showing a change of the data stored in a latch with time provided in the combination sense circuit and writing data latch in the writing operation according to the present embodiment.

FIG. 6 is a diagram for explaining the threshold values of the memory cells for each data at the time when the first writing stage is completed according to the present embodiment.

FIG. 7 is a diagram for explaining the threshold values of the memory cells for each data at the time when the second writing stage is completed according to the present embodiment.

FIG. 8 is a diagram for explaining the threshold values of the memory cells for each data at the time when the third writing stage is completed according to the present embodiment.

FIG. 10 is a diagram showing a change of the data stored in the latch with time provided in the combination sense circuit and writing data latch in the reading operation according to the present embodiment.

FIG. 14 is a diagram showing the threshold values of the memory cells for each data at the time when the writing operation is completed according to the conventional device.

FIG. 15 is a diagram for explaining the writing operation in the combination sense circuit and writing data latch shown in FIG. 13.

FIG. 16 is a diagram for explaining the threshold values of the memory cells for each data at the time when the first writing stage is completed in the conventional device.

FIG. 17 is a diagram for explaining the threshold values of the memory cells for each data at the time when the second writing stage is completed in the conventional device.

FIG. 18 is a diagram for explaining the threshold values of the memory cells for each data at the time when the third writing stage is completed in the conventional device.

DETAILED DESCRIPTION OF THE INVENTION

Hereinafter, the nonvolatile semiconductor memory devices of the present invention are described with reference to the attached drawings. The explanation of the present nonvolatile semiconductor memory devices is given by describing a four valued flash memory. The overall structure of the flash memory according to one embodiment of the present invention is similar to the conventional flash memory shown in FIG. 12, so that identical explanations are omitted.

In the present embodiment, each memory cell holds one of the data corresponding to a threshold value among four data from "00", "01", "10" to "11", similar to the conventional device. However, the present embodiment differs from the conventional device in that the data corresponding to the threshold values are arranged according to the gray scale.

Figure 2:
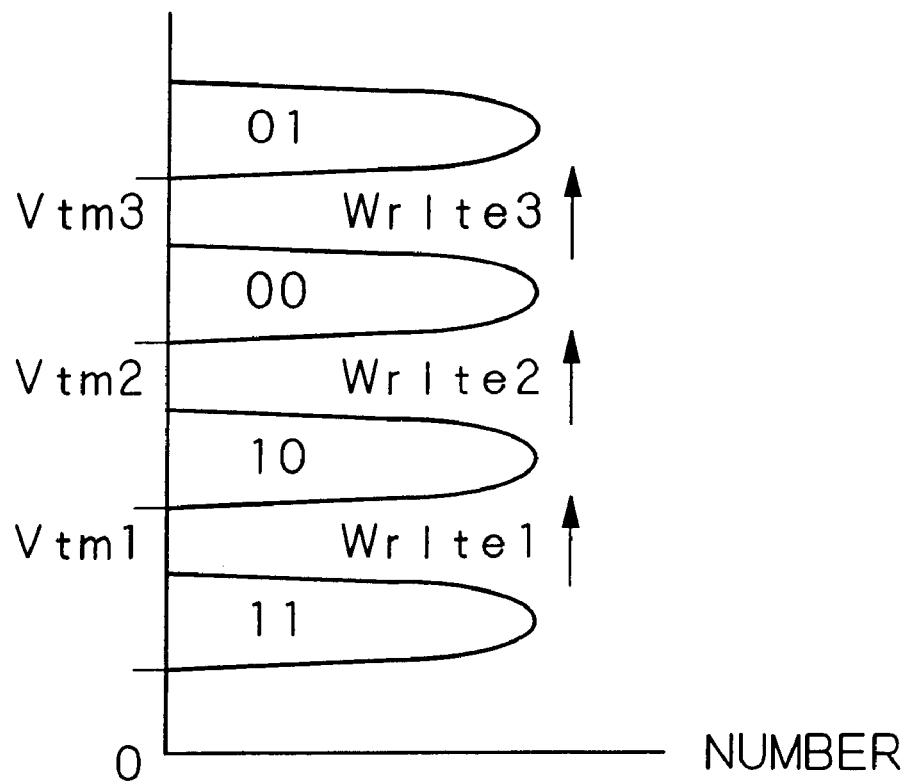
FIG. 2 is a diagram showing a corresponding relationship between threshold values of memory cells and the writing order in the present embodiment.

The threshold values in the conventional technique are arranged in the order of "11", "10", "01", "00". In contrast, in the present embodiment, as shown in FIG. 2, the threshold values are arranged in the order from the lowest "11", "10", "00" to the highest "01". In FIG. 2, the vertical axis represents the threshold values and the horizontal axis represents the total number of memory cells having each threshold potential. As described above, the dispersion of the threshold values generates a distribution of threshold potentials. Among four types of data, the data "11" is the level when the memory cells are erased, similar to the conventional technique. When the threshold values of the memory cells are less than Vtm1, the memory cell data is "11", when the threshold values are between Vtm1~Vtm2, the data is "10", when the value is Vtm2~Vtm3, the data is "00", and when the value is more than Vtm3, the data is "01".

(1) Explanation of the Structure

Figure 1:
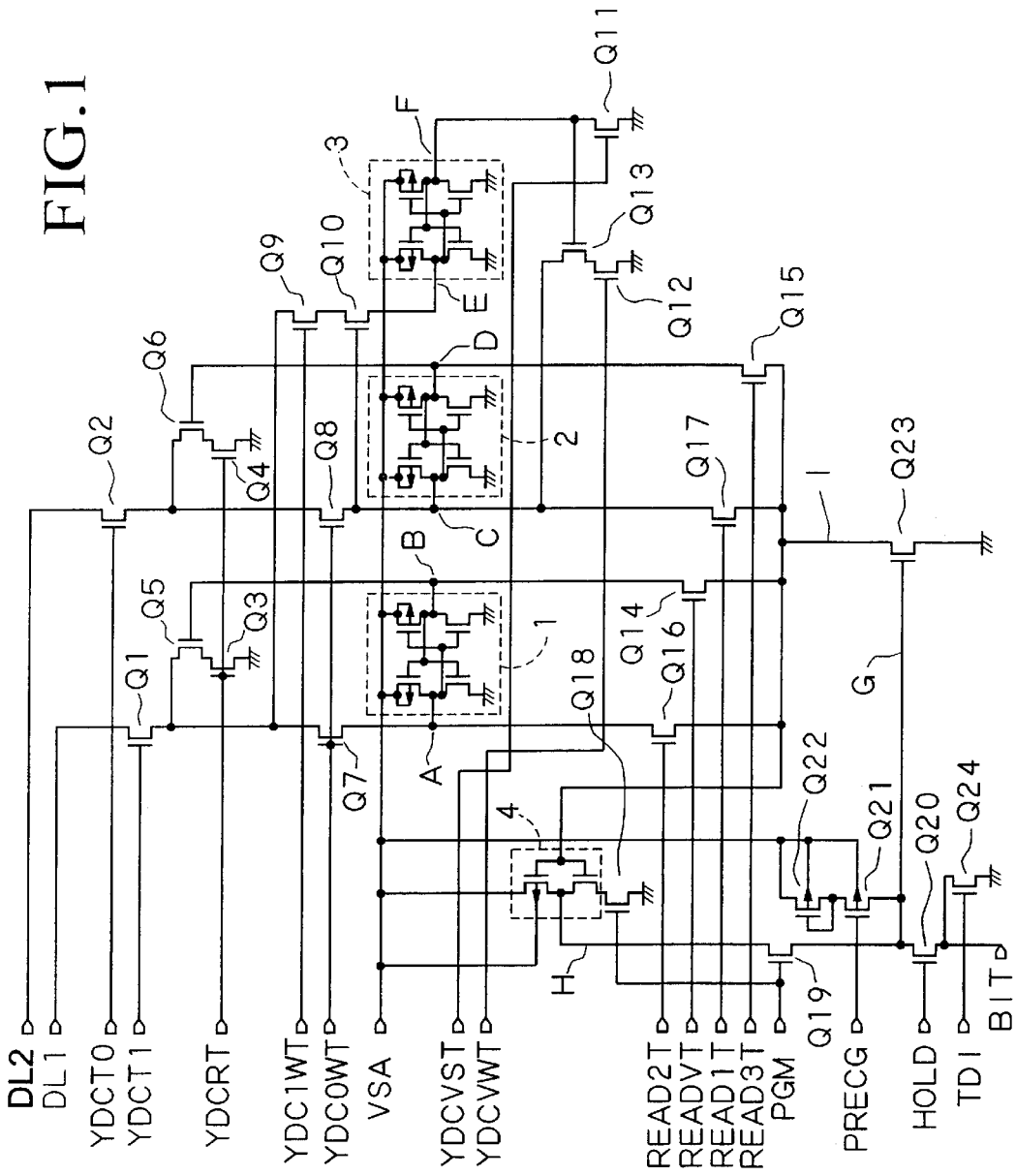
FIG. 1 is a diagram showing the structure of a sense amplifier and a writing data latch according to one embodiment of the present invention.

FIG. 1 is a diagram showing the structure of a sense amplifier and a writing data latch according to one embodiment of the present invention. As shown, the combination sense circuit and writing data latch of the present embodiment is provided with three latches 1, 2, and 3, in contrast to that the conventional combination sense circuit and writing data latch 104 is provided with only two latches. Each latch of the present embodiment, having the substantially same structure as those latches 110 and 111 shown in FIG. 13, is constructed by sequentially connecting two inverters comprising a P-channel transistor (hereinafter, sometimes abbreviated as "Tr"), whose source is connected with the sense amplifier source VSA, and an N-channel transistor, whose source is grounded. Here, the sense amplifier source VSA is supplied from the power source circuit not shown in FIG. 12, and the potential of the sense amplifier source is set to Vcc corresponding to the source voltage (not shown) at the time of reading, and at the time of writing, the sense amplifier source is set to "5 V".

When the data stored in the latch 1 or the latch 2 are to be used for writing into memory cells, if the stored data is "1", that means that "writing is prohibited", and if the stored data is "0", that means "writing is permitted". When the latch 1 or the latch 2 are used for verification, these latches store the results of the verification (any one of "00"~"11") by reading from the memory cells. In contrast, data stored in the latch 3 are used for the following purposes. Sequentially, since writing is carried out by three stages, the latch 3 is used for restoring in advance the content of the latch 2 to "0" (writing is permitted) in respective writing stages until the data having the highest threshold value (that is, "01") is written into the memory cells from the latch 2. In other words, the latch 3 plays the role of allowing the data stored in the latch 2 to turn into "0" (writing is permitted) so as to be able to accomplish writing into the memory cells from the latch 2 in sequence until the final stage of the writing process is completed. The latch 3 is not used in the reading and verification operation. The data stored in the latch 1 to the latch 3 are obtained at respective nodes A, C, and E, and their reversed outputs are obtained at nodes B, D, and F.

The data input and output between the flash memory 100 and the outside are carried by the data signals DL1 and DL2. That is, at the time of writing into the memory cells, the external data are supplied divided into two bits. At the time of reading from the memory cells, 2-bit data are read for being output to the internal bus line. At the time of the reading operation including the verification operation, these data signals DL1 and DL2 are precharged to the "H" level before the reading signal YDCRT (described later) is inverted to the "H" level. Next, the reference symbol YDCT1 and YDCT0 denote column decode signals supplied from the column decoder shown in FIG. 12 through the column gate 105. In addition, the N-channel transistor TrQ1 and the TrQ2 functions as switches for transferring data between the latch 1 and the latch 2 and the outside of the flash memory.

That is, when reading from the memory cell is completed and the read data are latched by the latch 1 and latch 2, the column decode signals YDCT1 and YDCT0 are inverted to "H" level during the timing cycle in which the data read from the combination sense circuit plus writing data latch 104 are output, and TrQ1 and TrQ2 are turned on. Furthermore, when the data to be written into the latch 1 and the latch 2 are set for writing into the memory cells, the column decoded signals TDCT1 and YDCT2 are inverted to "H" level and TrQ1 and TrQ2 are turned on after the data signals DL1 and DL2 are decided. All of the signals hereinafter described are control signals supplied from the control circuit 108 shown in FIG. 12, excluding the sense amplifier source VSA and the column decode signals YDCT0 and YDCT1.

The reading signal YDCRT is a timing signal which is inverted into "H" when the read data from memory cells are output from the latch 1 and latch 2, and during reading, the N-channel transistors TrQ3 and TrQ4 are turned on. When the TrQ3 and TrQ4 are turned on, the N-channel transistors TrQ5 and TrQ6 are turned on or turned off depending upon the levels of node B and node D, which are reversed outputs of the latch 1 and latch 2. As described above, the data signals DL1 and DL2 are precharged to the "H" level, before the reading signal YDCRT is inverted to "H". Thus, when the stored data in the latch 1 or the latch 2 is "1" (that is, the node B or node D is in the "H" level), both TrQ5 and TrQ6 are turned off, and the data signals DL1 and DL2 remain at "H" level due to the precharge. In contrast, when the data stored in the latch 1 or the latch 2 are "0" (that is, node B or node D is at the "H" level), both TrQ5 and TrQ6 are turned on, so that the "L" level is output to the data signal DL1 and DL2 through TrQ1 and TrQ2.

The writing data input signals YDC0WT and YDC1WT are timing signals for setting initial values for the latch 1, latch 2, and latch 3, at the time of the writing operation. That is, N-channel transistors TrQ7 and TrQ8 are turned on due to inversion of the input signal YDC0WT to the "H" level, and data signals DL1 and DL2 are respectively transmitted to the node A and the node B. N-channel transistors TrQ9 and TrQ10 are a part of circuit for setting an initial value in the latch 3. That is, every column decoded signal YDCT0 and the writing input signals YDC0WT and YDC1WT are all inverted to the "H" level for turning the TRQ2, TrQ8, and TrQ9 on. When the writing data is "01", since the data signal DL2 is at the "H" level, TrQ10 is turned on, the data stored in the latch 3 is initialized to "0" by the "L" level of the data signal DL1.

The latch reset signal YDCVST is a timing signal for setting an initial value for the latch 3 and the signal YDCVST is made effective prior to the above described writing data input signals YDC0WT and YDC1WT. An N-channel transistor TrQ11 is a remainder of the circuit for setting the initial value for the latch 3. Since the TrQ11 is turned on when the latch reset signal YDCVST is inverted to "H", a node F is grounded and the data stored in the latch 3 is intialized to "1".

The latch data transfer signal YDCVWT is a timing signal for transferring the data stored in the latch 3 to the latch 2 and the transfer is executed only when the data stored in the latch 3 is "0". That is, when the latch data transfer signal YDCVWT is inverted into the "H" level, and TRQ12 is turned on. Thus, since the TrQ11 is turned on when a node F corresponding to the reversed output of the latch 3 is inverted to the "H" level, the node F is grounded and the data of the latch 3 is initialized to "1".

The latched data transfer signal YDCVWT is a signal for transferring the stored data in the latch 3 to the latch 2, and the latched data is transferred only when the data in the latch 3 is "0". That is, when the latched data transfer signal YDCVWT is inverted to the "H" level, an N-channel transistor TrQ12 is turned on. Thus, if the node F corresponding to the reversed output of the latch 3 is at the "H" level, an N-channel transistor TrQ13 is turned on and the node C is grounded for converting the data stored in latch 3 to "0". In contrast, if the node F is at the "L" level, the TrQ13 is turned off, so that the potential of the node C does not change and the data in the latch 3 does not change.

Each reference symbols READ1T~READ3T and READVT denotes a latch selection signal. During writing, only the latch selection signals READ3T and READVT are used, and these two latch selection signals are also used at the time of the verification operation. In contrast, at the time of reading, the above-described four latch selection signals are used. Hereinafter, these latch selection signals will be described in detail, and an explanation is given first about the writing operation. The verification operation executed in the course of the writing operation will be described in the later section, since the verification operation is approximately the same as the reading operation.

First, the latch selection signal READVT becomes effective when writing is executed based on the stored data in the latch 3. That is, an N-channel transistor TrQ14 is turned on by inverting the latch selection signal READVT to the "H" level, and the level at the node B is transmitted to the input of the inverter 4. The inverter 4 outputs the level of the node I after inversion to a node H, and the writing to the memory cells is executed depending upon the output of the inverter 4. Similarly, the latch selection signal READ3T becomes effective when writing is executed based on the data stored in the latch 2. That is, an N-channel transistor TrQ15 is turned on by inverting the latch selection signal READ3T to the "H" level, so that the level of the node D is transmitted into the input of the inverter 4.

Next, the reading operation is described. As described later, the states of the memory cells are reflected in the level of the node I. The level of the node I is applied respectively to the node A and the node C by inverting the latch selection signals READ2T and READ1T. As a result, a TrQ16 and a TrQ17 are turned on or turned off, so that the stored data in the memory cells can be set in the latch 1 and the latch 2. Since the level of the node I is applied to the nodes B and D by inverting the latch selection signals READVT and READ3T to the "H" level, the reversed data of the node I level can be respectively applied to the node B and the node D, and the reversed data of the level of the node I are set in the latch 1 and the latch 2.

In contrast, in the case of the verification process, the state of the memory cell is read in the latch used for the writing process. Thus, the same latch selection signal as that used in the writing process among latch selection signals READ3T and READVT is used in the verification process.

The timings for becoming respective latch selection signals effective are described in the explanation of the operation.

A writing signal PGM is a signal for instructing whether or not writing into the memory cells is to be executed. When the writing signal PGM is inverted to the "H" level, N-channel transistors TrQ18 and TrQ19 are turned on, so that the level of the node I corresponding to the output of the inverter 4 is transmitted to a N-channel transistors TrQ20 through the TrQ19. In contrast, in the case of reading or verification operation, the writing signal is inverted to the "L" level such that the output of the inverter 4 is not transmitted to the TrQ20.

A precharge signal PRECG is a signal for pre-charging the node G to the "H" level in advance in the case of reading from the memory cells. A P-channel transistor TrQ21 is turned on by inverting the precharge signal to the "L" level, so that the bit line BIT is connected to the TrQ19 and an N-channel transistor TrQ23. In the case of the writing operation, since the TrQ19 is turned on, it becomes possible to write to the memory cells through the bit line BIT in accordance with the output level of the inverter 4.

In the case of reading, the state of the memory cells is applied to the node G through the TrQ20 via the bit line BIT. Since an N-channel transistor TrQ23 is turned on or off in response to the potential of the anode G, the reversed level of the node G is obtained at the node I.

The reference symbol TDI denotes a bit line reset signal for resetting the bit line to the "L" level. An N-channel transistor TrQ24 is turned on when the bit line reset signal TD1 is inverted to the "H" level, and the bit line BIT is grounded.

(2) Explanation of the Operation

An operation of the flash memory having the above-described structure is described. Hereinafter, the operation during writing which is the characteristic feature of the present invention is first described. In addition, the reading operation, carried out in the same manner as that of the verification operation, will be described following the writing operation.

Figure 4:
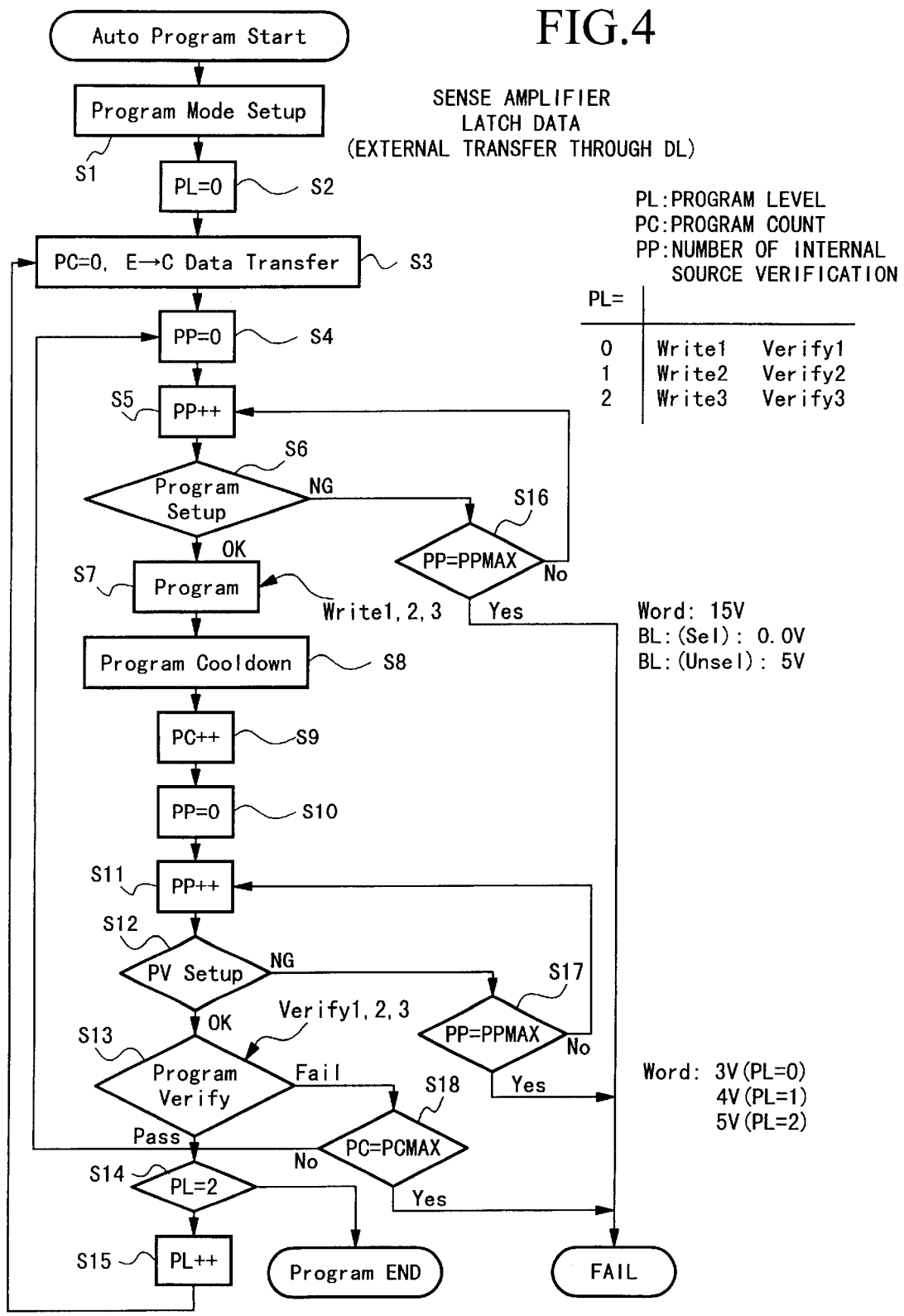
FIG. 4 is a flow chart showing the writing procedure according to the present embodiment of this invention.
Figure 5:
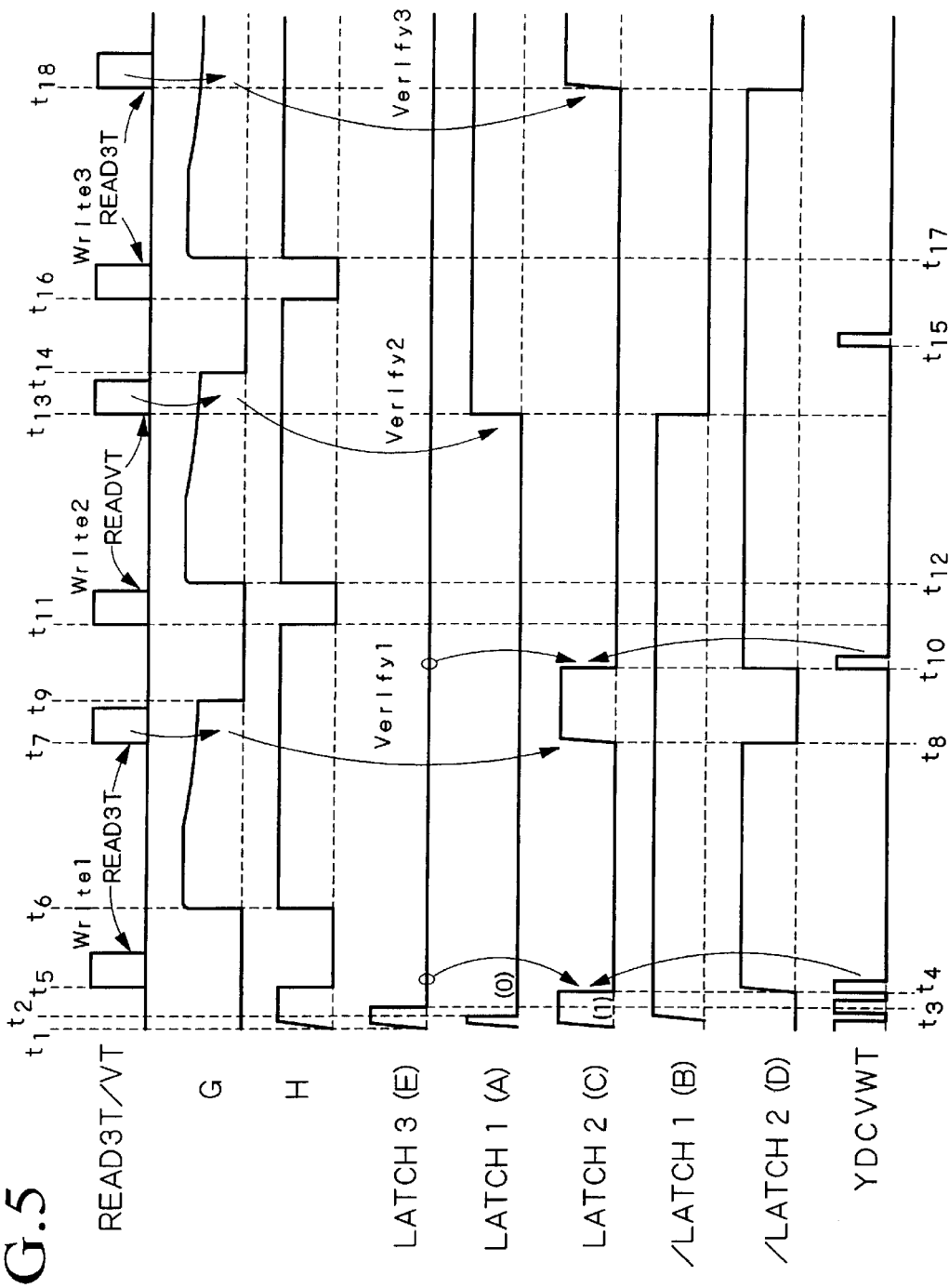
FIG. 5 is a timing chart showing the writing operation to the memory cells according to the present embodiment.

FIG. 3 is a diagram showing the time series transition of data stored in latches 1 to 3, and four types of writing data are shown individually. FIG. 4 is a flow chart showing the writing procedure. FIG. 5 is a timing chart of main signals during writing operation to the memory cells, in the case of the writing data is "0".

① Writing Operation

First, the writing operation is described briefly. In the present embodiment, since there are also four levels of writing states, the writing operations for three levels excluding the erasure level and verification operations executed following the writing operation are the same as those of the conventional technique. However, as described above, since the present embodiment uses a different correspondence between the threshold values and the writing data from the conventional technique, the writing operation of the present embodiment differs from conventional writing operation. In the present embodiment, the writing data of "11" is not written, and the data of "10", "00", and "01" are written for respective amounts of the first stage, the second stage, and third stage. That is, writing of the first stage (FIG. 6) is executed for the writing data "10", "00", and "01", to the threshold value of Vtm1, writing of the second stages (FIG. 7) are executed for the writing data "00" and "01" to the threshold value of Vtm2, and finally writing of the third stage (FIG. 8) is executed for the data "01" to the threshold value of Vtm3.

Reference symbols used in FIG. 4 are explained in advance. A variable PL (Program Level) indicates a level of the writing and the verification operations at a point of time, since writing and verification operations are executed in three stages. A variable PC (Program Count) indicates the number of times writing occurs in respective writing and verification stages. A constant PCMAX is for restricting the number of times for writing and verification operations.

Furthermore, a variable PP is used for monitoring a time whether or not the output of the booster circuit 107 reaches a predetermined voltage within a predetermined time. The control circuit 108 judges for every predetermined time whether or not the voltage of the booster circuit 107 reaches a predetermined voltage. If the voltage of the booster circuit does not reach the predetermined voltage within the predetermined number PPMAX of judgement times, the processing is discontinued. These variables and constants are stored in the control circuit 108.

The writing operation is started by a collective erasure of a block of memory cells which includes the memory cells to be written, and the stored data is initialized into "11", which corresponds to the erasure level. Since the erasure operation itself is the same as that of the conventional technique, the explanation is omitted. Next, before entering into the actual writing operation, initial values corresponding to the data (data shown in "write data" in FIG. 3) to be written in the latches 1 to 3 are set. As shown in FIG. 3, the data themselves to be written in the latches 1 to 2 are set as the initial values. Regarding the latch 3, "0" is set when the data to be written is "01", and "1" is set when the data to be written is not "01".

Figure 12:
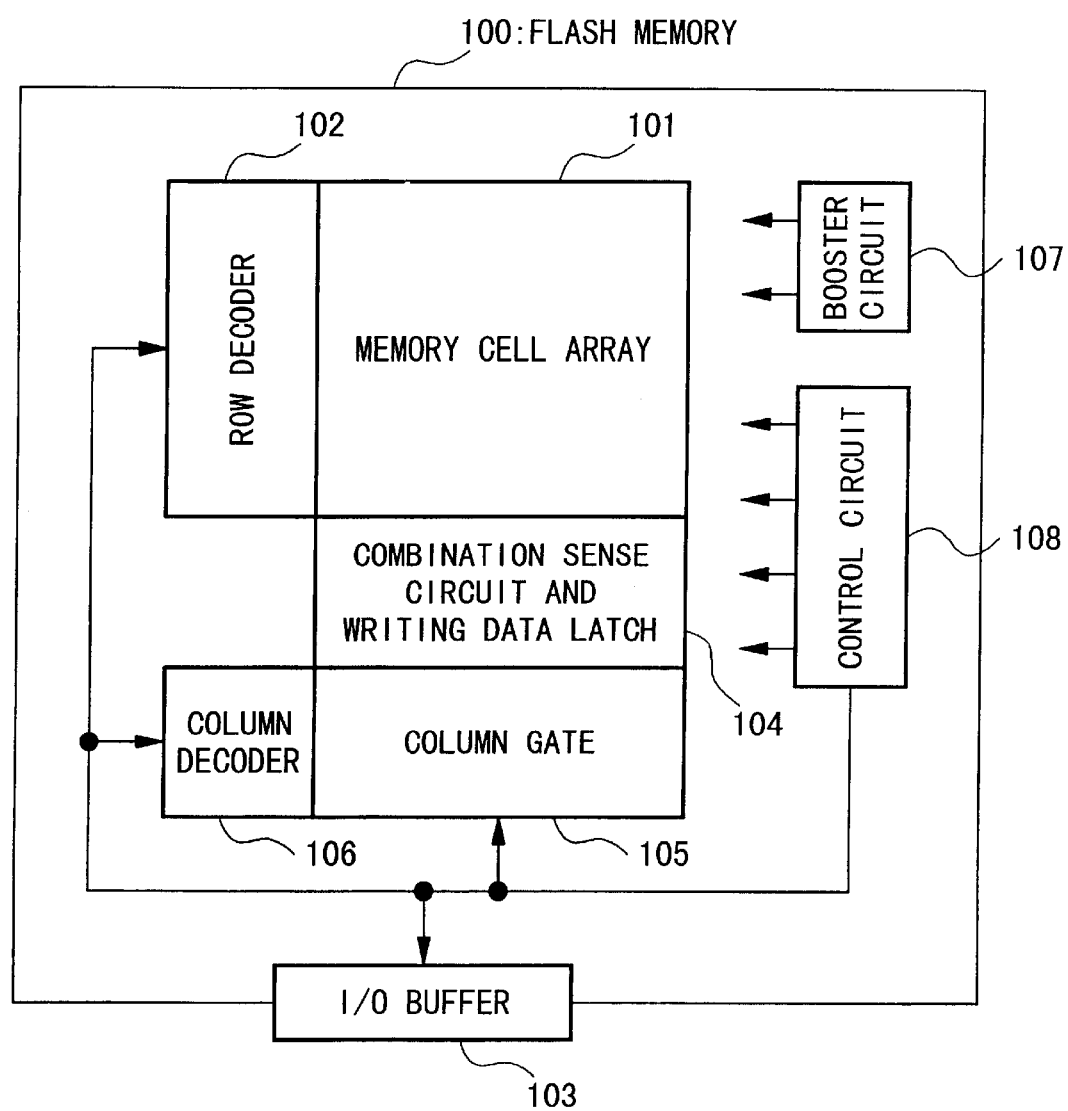
FIG. 12 is a block diagram showing the overall structure of a flash memory.
Figure 13:
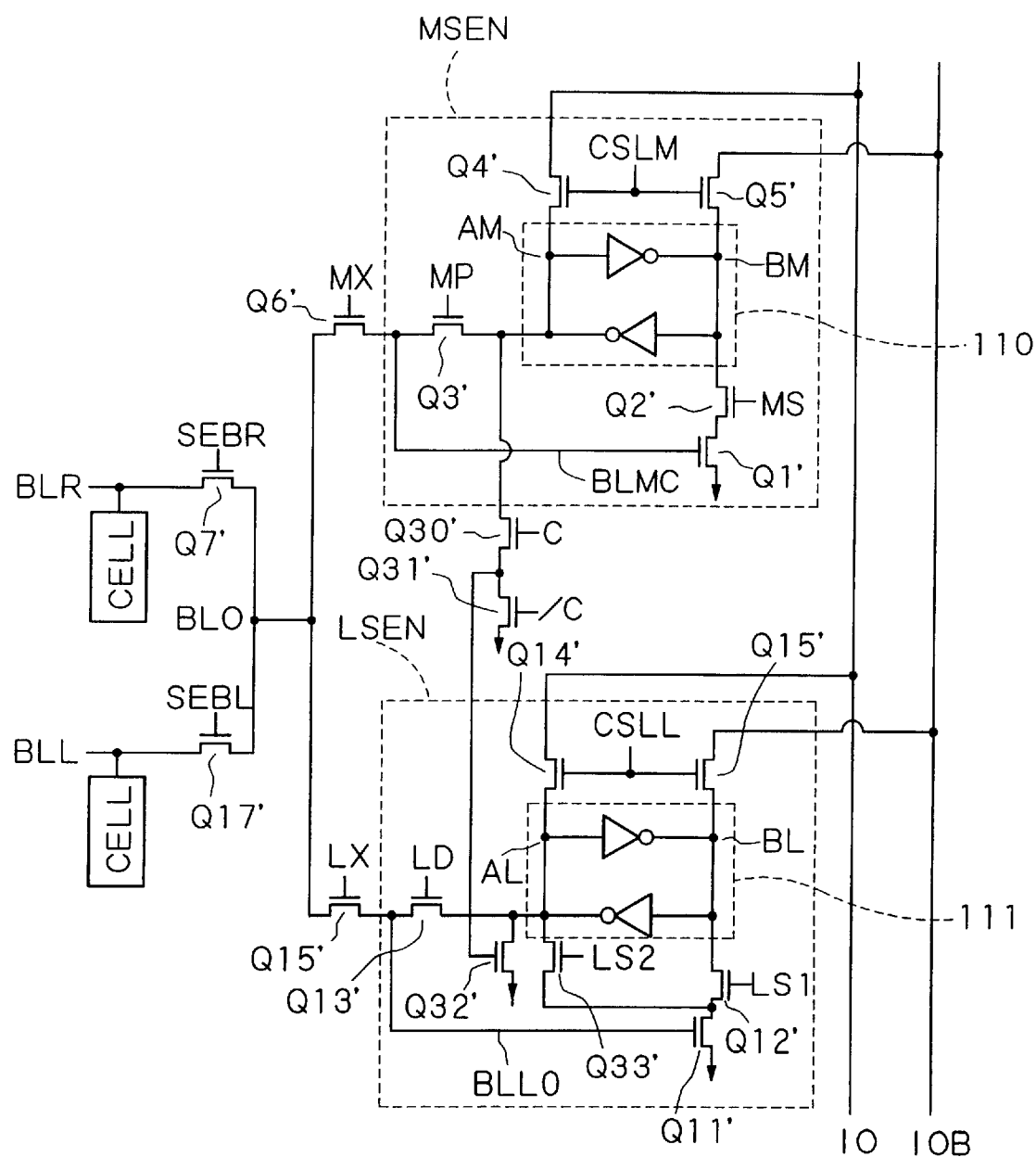
FIG. 13 is a circuit diagram showing the structure of a combination sense circuit and writing data latch in a conventional flash memory.

Accordingly, the data to be written in the memory cell is given to the data signal DL1 and DL2 through the internal bus line in FIG. 12 (not shown). Next, the control circuit 108 gives a pulse to the latch reset signal YDCVST for converting the data stored in the latch 3 into "1" (node E at the time t1) by inverting the latch reset signal to "H". The column decoder 106 inverts the column decode signals YDCT0 and YDCT1 to "H" after executing a column selection. The control circuit 108, on the other hand, inverts the writing data input signals YDC0WT and YDC1WT to "H". Thereby, the data signal DL1 and DL2 are respectively set into the latch 1 and 2 (node A and C at the time t2). At this time, if the writing data is "01", the value "0" of the data signal DL1 is set in the latch 3 through TrQ9 and TrQ10 (node E at the time t3, the above operation is S1).

Next, in order to execute the first writing and first verification operations, the control circuit 108 initially sets the variable PC to "0" (step S3) after the variable PL is initially set to "0" (step S2). Next, the control circuit 108 gives a pulse for inverting the latch data transfer signal YDCVWT to "H", and the data stored in the latch 3 is transferred to the latch 2 if the data stored in the latch 3 is "0". As a result, when the data to be written is "01", the data stored in the latch 2 changes to "0" (time t4, the above operation is step S3).

Next, whether or not writing is executed is determined according to the data stored in the latch 2. First, a voltage, for example, 15 V is applied to the word line, connected to the memory cell to be written. On that account, the control circuit 108 initializes the variable PP to "0" (step S4) and instructs the boosting circuit 107 to generate the word line voltage. The control circuit 108 increments the variable PP by "1" (step S5) and inquires whether or not the voltage of the boosting circuit reaches to 15 V. If the voltage is not reached (NG at step S6), the above operation is repeated after waiting for a predetermined time. While doing so, if the variable reaches the constant PPMAX (Yes at step S16), the control circuit 108 considers that there is something wrong and stops processing.

In contrast, if the voltage of the booster circuit 107 reaches 15 V (OK at step S6), the control circuit enters the process of the actual writing operation. That is, the control circuit 108 transfers the data stored in the latch 2 (actually, the reversed data output to the node D) to the inverter 4 by supplying a pulse to the latch selection signal READ3T for inverting to "H" (time t5). Next, the control circuit 108 applies the level of the node H to the bit line BIT by inverting the writing signal PGM and the bit line selection signal HOLD to "H".

Consequently, when the data stored in the latch 2 is "0", and the writing operation is permitted, the node D corresponding to the reversed output of the latch 2 is at the "H" level, the node H corresponding to the output of the inverter 4 is inverted to the "L" level, and a voltage, for example, "0 V" is applied to the bit line BIT. In contrast, if the data in the latch 2 is "1" and writing is prohibited, the node H is inverted to the "H" level so that the source voltage of the sense amplifier (as described above, the source voltage during writing is "5 V") is applied to the bit line BIT. At this point, since the data stored in the latch 2 is "0" when the writing data is not "11", those writing data except "11" are written into the memory cells through the bit line BIT (step S7). Here, the control circuit 108 determines one writing time when writing, and this procedure is carried out by the similar manner as that of the conventional technique, so that the explanation is omitted.

When the time for one writing operation has elapsed, the control circuit 108 completes the writing operation. Accordingly, the control circuit 108 instructs the booster circuit 107 to stop applying a voltage to the word line. The control circuit then inverts both of the bit line selection signal HOLD and the writing signal PGM to the "L" level, and inverts the bit line reset signal TD1 to the "H" level by supplying a pulse (step S8). The control circuit 108 increments the variable PC by one, which shows that one writing operation is finished.

Next, a verification operation starts for verifying whether or not the threshold value of the memory cell after the writing operation has reached the voltage Vtm1 corresponding to the data "10". The control circuit 108 then applies a voltage using of the boosting circuit 107, for example, 3 V, which is a little higher than the threshold voltage Vtm1 shown in FIG. 2. The control circuit 108 inverts the precharge signal PRECG to the "L" level by supplying a pulse, and inverts the bit line selection signal HOLD to the "H" level by supplying a pulse as well. Thereby, the voltages of both the node G and the bit line BIT are precharged to the "H" level (time t6). Since the node I is inverted to the "L" level due to the inversion of the node G to the "H" level, the node H corresponding to the output of the inverter 4 is also inverted to the "H" level.

The procedure for generating the voltage applied to the word line is the same as that at the time of writing operation (step S4 to S6 and step S16), and the only difference is that the voltage is applied to the word line (step S10 to S12 and S17). Thus, if the voltage generated by the boosting circuit 107 does not reach the designated voltage within a predetermined time, the control circuit 108 suspends the processing.

If it becomes possible to apply "3 V" to the word line (step 12 is "OK") within the above-described time, the control circuit 108 waits for a predetermined time until the memory cells are ready to be read to the bit line BIT. Thereby, the data according to the threshold value of the selected memory cell is carried on the bit line BIT. Next, the control circuit 108 inverts the latch selection signal READ3T to "H" by applying a pulse, in order to read the state of the memory cell through the bit line BIT as the verified result.

If the threshold value of the memory cell is less than Vtm1 (this is called that "the result of the verification is "FAIL"), the memory cell is turned on by the application of the word line voltage. Consequently, the charges accumulated in the bit line BIT and in the node G are withdrawn through the memory cell, these potentials are inverted to the "L" level, TrQ23 is turned off, and the data stored in the latch 2 remains at "0" due to the unchanged potential of the node G. In contrast, if the threshold value of the memory cell is more than Vtm1, the memory cell is turned off. Accordingly, the potential of the sense amplifier VSA (as described above, this potential is the source voltage Vcc, due to the verification operation) caused by the precharge executed in advance remains in the node G, so that TrQ23 is turned on. Thus, when the node D is grounded, the node C is inverted to the "H" level, the data stored in the latch 2 is reversed from "0" to "1".

As shown above, if the threshold value of the memory cell attains a certain predetermined value (in this case, the result of the verification is "PASS"), the data stored in the latch 2 is changed to "1" (nodes C and D at time t8), or remains "0" corresponding to the "Writing Permitted" condition. Here, the writing and verification operations are repeated in the latter case, but the repeated operations are not depicted in FIG. 5.

Thereafter, the control circuit 108 turns the potential of the bit line BIT into "0 V" by applying a pulse to the bit line reset signal TDI. At this time, the node G is inverted to the "L" level (time t9) together with the potential change of the bit line, by maintaining the bit line selection signal at the "H" level.

Next, the following processing is executed in order to make a judgement whether or not the writing and verification operations should be repeated (S13). First, the potential of the internal bus line is maintained at the source voltage Vcc, and the data signals DL1 and DL2 are precharged into the "H" level. The control circuit 108 inverts the read signal YDCRT to the "H" level until the verification is completed, and also inverts the column decode signal YDCT0, sent to the column decider 106 as an instruction, to the "H" level. At this time, if the data stored in the latch 2 is "1" (the node D is at the "H" level), TrQ6 is turned off, so that the potential of the internal bus line does not change and it remains at the source voltage. In contrast, if the data stored in the latch 2 is "0" (the node is at the "H" level), TrQ6 is turned on, and the internal bus line is grounded and inverted to the "H" level through the TrQ4, TrQ6, and TrQ2.

To sum up, if all of the verification results of the combination sense circuit and writing data are "PASS", since the data is stored in the latch 2 in the combination sense circuit and writing data latch, the potential is maintained at the source voltage Vcc. The control circuit 108, accordingly, examines the level of the internal bus line, and if the potential of the internal line is maintained at the source voltage Vcc, the control circuit 108 shifts its self control to the second writing operation (Step S13 is PASS). In contrast, if one of verification results shows the "FAIL", the internal bus line is inverted to the "L" level. In such a case, the control circuit 108 makes the above-described writing and verification operations execute repeatedly until all of the verification results are converted to "PASS" (step Sa to S13 and S16 to S18).

During the above-described repeating operations, regarding memory cells, whose threshold values already exceed Vtm1, the data stored in the latch 2 is set to "1" corresponding to "writing prohibited". That is, the excess writing is prohibited for these memory cells. If, in the repeating operations, none of the results of verification are not changed to "PASS" after writing for the predetermined number, the control circuit 108 makes the processing stop because something is considered to be wrong. In contrast, if all verification results are changed to "PASS" (step S13 is "PASS"), the first writing and the first verification operations are completed.

Next, in order to execute the second writing and the second verification operations, the control circuit 108 adds an increment of "1" to the variable PL for changing the variable PL to "2" (step S15). The operations in the second stage are basically similar to those of the first stage (steps S3 to S18). The differences between the second stage and the first stage is that the latch 1 is used instead of the latch 2 for determining whether or not the writing has been executed and for reading the verification results, that the voltage used at the verification is based on Vtm2, and that the reading of the verification results is conducted by the data signal DL1.

In detail, first, the control circuit 108 transfers the data stored in the latch 3 to the latch 2, when the data in the latch 3 is "0". As a result, the data stored in the latch 2 is restored to "0" only when the writing data is "01", and the nodes C and D are respectively inverted into the "L" level and the "H" level (time t10). Next, it is determined whether reading has been executed or not according to the data stored in the latch 1, not the latch 2. The control circuit 108 applies the "15 V" to the word line (step S6) through the boosting circuit 107, inverts the latch selection signal READVT by supplying a pulse, and transfers the data stored in the latch 1 (more accurately, the node D level corresponding to reversed output) to the inverter 4 (time t11).

Next, the control circuit 108 inverts both of the writing signal PGM and the bit line selection signal HOLD to the "H" levels, and applies the node H level to the bit line BIT. Consequently, the writing is executed for the memory cells whose data stored in the latch 1 is "0". In this case, since the writing is started whose writing data are "00" or "01", the control circuit 108 makes the writing operation be completed when completion of the writing operation has been determined, similar to the first writing operation (step S8).

Next, in order to execute the verification process for the memory cells as to whether the threshold values of those memory cells have reached the potential Vtm2 corresponding to the data "00", the control circuit 108 shifts the self control to the second verification operation. In this case, the control circuit 108 instructs to apply to the word line a potential, for example, "4 V", which is a little higher than the threshold voltage Vtm2 (step S12). Next, the control circuit 108 precharges the node G voltage to the "H" level, inverts the latch selection signal READVT to the "H" level by supplying a pulse, and connects the bit line BIT and the node G by inverting the bit line selection signal HOLD to the "H" level. As a result, when the threshold value of the memory cell is less than Vtm2, the data stored in the latch 1 remains unchanged at "0". In contrast, when the threshold value Vtm2 is more than Vtm2, the data in the latch 1 is inverted to "1" from "0". After the state of the memory cells is reflected to the latch 1, the bit line BIT is reset for completing the second verification operation (time t14).

Next, in order to judge whether the writing and verification operations are repeated, the same procedure as the first verification operation is repeated. In this case, however, the verification results are stored in the latch 1, the control circuit 108 inverts the column decode signals YDCT1, instead of the column decode signal YDCT0, to the "H" level. In addition, the verification results are output to the internal bus line according to the node B potential corresponding to the data stored in the latch 1 through TrQ5, TrQ1, and the data signal DL1. In this case, if the data stored in the latch 1 is "1", TrQ5 is turned off so that the potential of the internal bus line remains at the source voltage Vcc. If the data stored in the latch 1 is "00", since TrQ5 is turned off, the internal bus line is grounded through TrQ3, TrQ5, and TrQ1 and the data signal DL1.

Therefore, similar to the explanation related to the first verification operation, the second writing and the second verification operations are repeated until every verification result of the combination sense circuit and writing data latch becomes "PASS" (step S13). As a result, the threshold values of every written memory cell exceed Vtm2 and the data stored in the latch 1 for latches of the combination sense circuit and writing data latch are turned to "1". Similar to the case of the first writing operation, the repeated operations when the verification results are in "FAIL" are not shown in FIG. 5.

By the operations shown above, the second writing and second verification operations concerning the writing data "00" and "01" are completed.

In order to carry out the writing and verification operations at the third stage, the control circuit 108 updates the variable PL into "2" (step S15). The writing and verification operations at the third stage are similar to those at the first stage, except that the potential used at the time of verification is based on the Vtm3.

In detail, the control circuit 108 transfers the data stored in the latch 3 to the latch 2 when the data in the latch 3 is "0" (time t15, step S3). In this case, none of the writing data stored in the latch 2 changes. Next, the control circuit 108 executes writing operation in the same manner as that in the writing operation at the first stage. The writing operation is executed for the memory cells whose writing data is "01" (step S7). The timing of the time t16 and t17 in this third writing operation corresponds to the timing of the time t5 and t6 in the first writing operation. In order to verify for the written memory cells whether the threshold values has attained the voltage of Vtm3 which corresponds to the data "01", the control circuit shift the self processing to the verification operation. In this case, the control circuit 108 instructs the boosting circuit 107 to apply a voltage, for example, "5 V", a little higher voltage than the threshold voltage Vtm3 to the word line (step S12). Except for the above operation, the other operations are the same as those of the first verification operation. Thus, if the threshold value of the memory cell is less than Vtm3, the data in the latch 2 remains "0", and if the threshold value of the memory cell is more than Vtm3, the data in the latch 2 is inverted from "0" to "1" (nodes C and D at the time t18).

Next, similar to the first verification operation, the control circuit 108 judges based on the verification results whether the verification operation should be repeated. The third writing and verification operation are repeated until all of the verification results of the combination sense circuit and writing data latch are turned into "PASS" (step S13). These repeating operations are not shown in FIG. 5, similar to the first stage and the second stage. When all of the verification results are turned into "PASS", the step S14 becomes "Yes", and the writing operations of the four types of writing data for the memory cells are completed.

② Reading Operation

Hereinafter, reading operations from the memory cells are described. The reading operations are basically the same as that of the verification operation. That is, in the reading operations, the same operations as those in the verification operations are carried out, including the operations wherein the data signals DL1 and DL2 are precharged to the "H" level, that the bit line and the node G are precharged, that the state of the memory cells at the time of reading is reflected to the bit line BIT and the node G, the levels of the bit line BIT and the node G are input into any one of the latches after the latch selection signal is inverted to the "H" level, and the bit line BIT is reset after inputting to the latch and decreasing the potential of the word line.

In the following description, the potentials to be applied to the word line and selection of the latch from among the latches 1 to 3 for latching the read results are explained.

Figure 9:
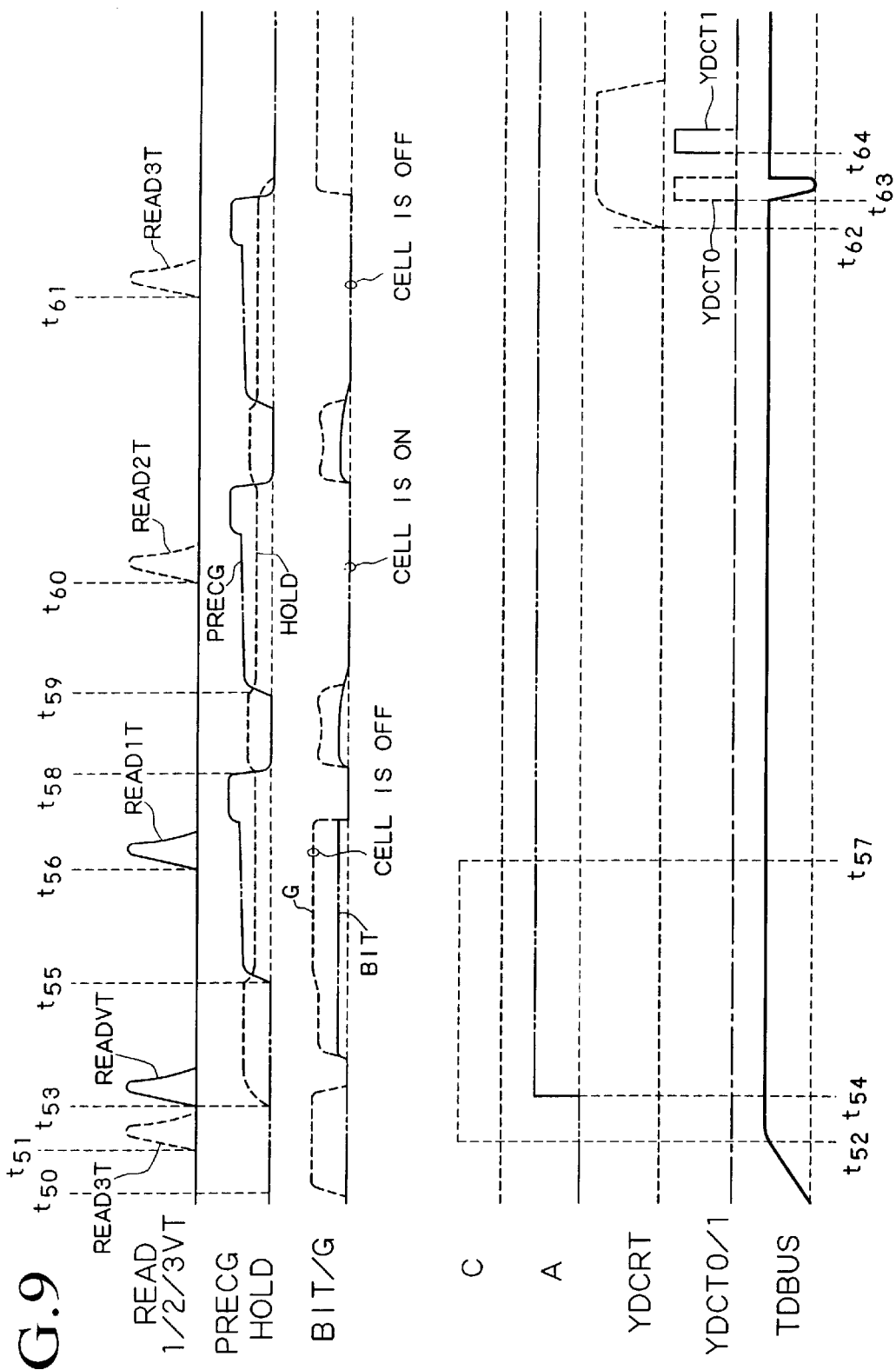
FIG. 9 is a timing chart showing the reading operation from the memory cells according to the present embodiment.

FIG. 9 shows timing waveforms of the main signals for describing the reading operation. FIG. 9 shows the operation of reading memory cells having the threshold value corresponding to the data "10". In this case, the threshold value of the memory cells is within a range of: the potential Vtm1<the threshold value of the memory cells<potential Vtm2. FIG. 10 shows the time series representation of application timings of the latch selection signals READ1T to READ3T, and READVT, and the change of the data stored in the latch 1 and 2, for respective read data. As described in the following, the reading operation uses only the latches 1 and 2, and does not use the latch 3.

In the reading operation, first, the data stored in the latches 1 and 2 are initialized into "1". For that purpose, the control circuit 108 sets the precharge signal PRECG and the bit line selection signal HOLD to the "L" level (time t50). By doing so, the node G is precharged at the sense amplifier voltage VSA (the source voltage Vcc), and the node I is turned to the "L" level. Next, the control circuit 108 inputs the pulse to the latch selection circuit READ3T (time t51) for inverting to the "H" level. The "L" level of the node I is applied to the node D, and the node G is inverted to the "H" level (time t52). Consequently, the data stored in the latch 2 is initialized into "1".

Next, the control circuit 108 restores the bit line selection signal HOLD to the "H" level, maintains the "H" level until the reading is completed, and inverts the latch selection signal READVT to the "H" level by inputting a pulse (time t53). As a result, the "L" level is applied to the node B by an operation similar to applying a pulse to the latch selection circuit READ3T (time t54). Thus, the node A is inverted to the "H" level and the data stored in the latch 1 is initialized to "1" (time t54). After then, the pre-charging signal PRECG is restored to the "H" level, and the pre-charging operation is stopped (time t55).

A processing is then carried out to set the latch 2 (lower rank bit) to "0", when the read data is not "11". The control circuit 108, after instructing the word line to input a potential of Vtm1, inputs a pulse to the latch selection circuit READ1T for inverting it to the "H" level. However, since the potential of the word line is still lower than the threshold value of the memory cell, the memory cell is turned off and the node G is left in the precharged state. Thus, the node G is inverted to the "L" level, this "L" level is applied to the node C (time t57), and the data in the latch 2 is changed to "0". Thereafter, the precharge signal PRECG is maintained at the "L" level for a while for precharging the node G to be ready for reading. This precharging operation is similarly executed in the following reading operations.

Next, processing to set the latch 1 (higher rank bit) is "0" is carried out when the higher rank bit of the read data is "0". Here, since the read data is "10", the data stored in the latches 1 and 2 is not changed. That is, in this case, the control circuit 108 inverts the latch selection signal READ2T to the "H" level by supplying a pulse (time t60), after instructing applying the potential Vtm2 to the word line. The potential of the word line then becomes higher than the threshold value of the word line, and the memory cell becomes turned on and accordingly the node G is inverted into the "L" level. The transistor TrQ23 is turned off, the potential of the node A does not change, and the data stored in the latch 1 remains at "1".

As described above, the data in the latch 2 (lower rank bit) is set to "0" when the read data is other than "11", the stored data in the latch 2 is set to "1" when the read data is "01". The stored data in the latches 1 and 2 are not changed since the read data is "10". In this case, the control circuit 108 inverts the latch selection signal READ3T to the "H" level, after instructing applying a potential of Vtm3 to the word line. In this case, the potential of the word line becomes higher than that of the threshold value of the memory cell, the memory cell is turned on and the node G is inverted to the "L" level. Thus, the node G is maintained at the same potential, and the stored data in the latch 2 remains unchanged at "0".

The data "01" in the memory cell is extracted from the latches 1 and 2 by the above described operation. The control circuit 108 then reads the data extracted from the latches on the internal word line (not shown). For the purpose, the control circuit 108 inverts the read signal to the "H" level (the time t62) until the reading operation is completed. Next, the control circuit 108 inverts the column decode signal YDCT0 to the "H" level by supplying a pulse, and outputs the potential of the node D, which corresponds to the reversed output of the latches 1 and 2, to the data signal DL2 through the transistors TrQ6 and TrQ2. Thereby, the data "0" is obtained as the lower rank data on the internal bus line ("TDBUS" in the figure). Next, the control circuit 108 inverts the column decode signal YDCT1 to the "H" level by supplying a pulse, and outputs the potential of the node B, which corresponds to the reversed output of the latch 1, to the data signal DL1 through transistors TrQ5 and TrQ1. Thereby, the data "1" is obtained as the lower rank data on the internal bus line. The reading operation is completed by the above procedure.

The same procedures are followed for reading the read data excluding "10". When the read data is "11", the latch selection signals READ3T and READVT are inverted to the "H" level and the stored data in the latches 1 and 2 are initialized. Next, while changing the voltage applied to the word line in the order of Vtm1, Vtm2, and Vtm3, a pulse is supplied in sequence to the respective latch selecting signals READ1T, READ2T, and READ3T. Similar to the case of the read data "10", if the potential of the wired line is higher than the threshold value of the memory cell, the memory cell is turned on and the node G is inverted to the "L" level, so that the data stored in the latches 1 or 2 is left unchanged. Since all of the above three voltages applied to the word line are higher than the threshold value of the memory cell, the data "11" at the time of initialization remains unchanged until the reading operation is completed.

When the read data is "00", the potentials Vtm2 and Vtm3 are related with the threshold value as, Vtm2≦the threshold value of the memory cell<the potential Vtm3. First, the data in the latches 1 and 2 are initialized to "11", similar to the cases of the read data being "11" or "10". Next, the voltage to be applied to the word line is set at Vtm1 and the latch selection signal is inverted to the "H" level, the latch 2 is set to "0", similar to the case of the read data being "10". Subsequently, the voltage applied to the word line is changed to Vtm2 and the latch selection signal READ 2t is inverted to the "H" level. In contrast to the case of "10", if the potential Vtm2 of the word line is lower than the threshold value of the memory cell, then the memory cell is turned off and the pre-charged potential remains. As a result, the potential of the node I, now inverted to the "L" level, is applied to the node A and the data stored in the latch 1 is converted to "0". Thereafter, the voltage applied to the word line is changed to Vtm3 and the latch selection signal is inverted to the "H" level. At this time, since the potential applied to the word line exceeds the threshold value of the memory cell, the stored data in the latch 1 and 2 are read as they are at "00".

When the read data is "01", the potential Vtm3 is related as, Vtm3≦the threshold value of the memory cell. Accordingly, in this case, similar to the case of the read data being "00", the data stored in the latches 1 and 2 are converted to "00" by supplying a pulse to the latch selection signals READ1T and READ2T while the voltage applied to the word line is changed to Vtm1 and Vtm2 after the data stored in the latches 1 and 2 are initialized into "11". When the voltage applied to the word line is changed to Vtm3 and when supplying a pulse to the latch selection signal READ3T, the memory cell is turned off and the node I is inverted to the "L" level because the potential Vtm3 is lower than the threshold value of the memory cell which is turned off, in contrast to the case of the read data being "00". When this potential is applied to the node D, the data stored in the latch 2 is turned off, the data "01" is stored in the latches 1 and 2, and the reading operation is completed.

As described above, the present embodiment does not require any reading operation from the memory cell in the writing operation except in the verification process, so that the total time for the writing operation can be reduced.

Figure 19:
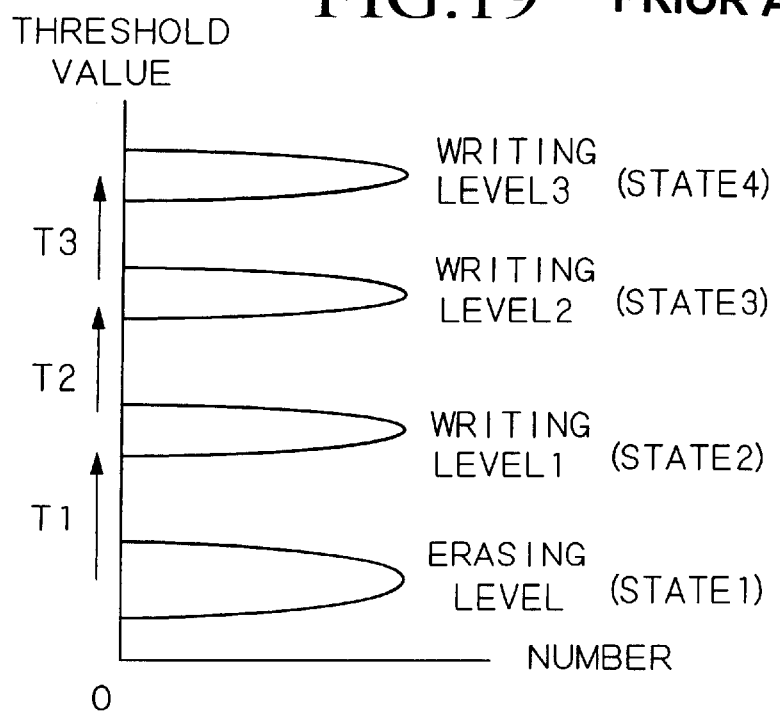
FIG. 19 is a diagram for explaining a distribution of threshold values of memory cells corresponding to four types of written data.
Figure 20:
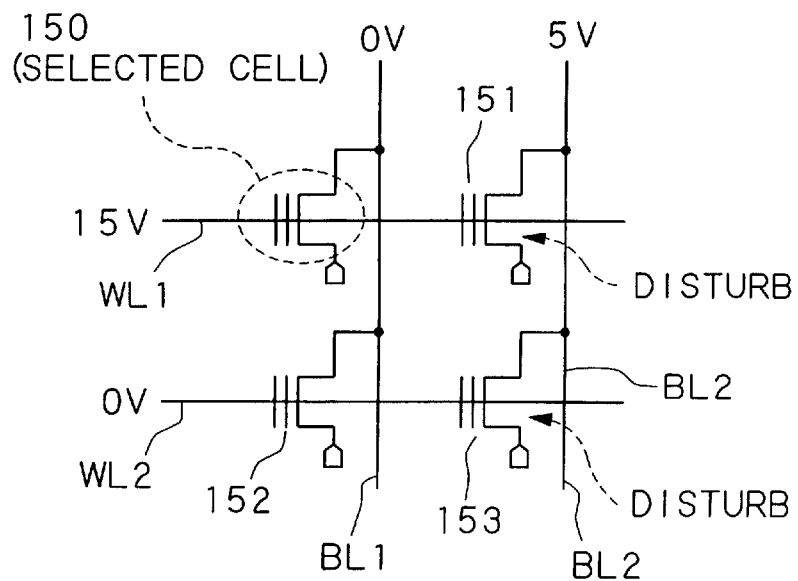
FIG. 20 is a diagram for explaining the disturbed state of non-selected memory cells by the applied high voltage.

In the present embodiment, the writing into the memory cell is executed in sequence from the lowest threshold value toward higher threshold values. As shown in FIG. 19, the writing operation can be executed in the order from the erasure level→the writing level→the writing level 2 the→writing level 3, so that the total time for the writing operation is only (T1+T2+T3). Assuming that T1=T2=T3, the total time of the writing operation according to this embodiment can be three quarters of the writing time of the conventional technique.

In addition, since the writing operation from the erasure level to the writing level 1 can be completed by one time operation without necessitating two time operations, it is possible to reduce the opportunity for causing disturbance, which results in improving the reliability of the memory cell and the semiconductor chips as a whole.

Since the writing data for respective threshold values of the memory cell are formed by the gray codes, only one defective bit results, even when a threshold value is reduced for some reason, not causing two defective bits as the case of the conventional technique. This is effective in improving the reliability of chips and improving the production yield. Since the present invention requires error correction of only one bit in contrast to two bits in the conventional technique, the error correction circuit of the present invention can be simple, and the redundancy bits needed for the error correction can be reduced.

(3) Modified Examples

In the above embodiment, an explanation is given for the four valued case. It should be noted, however, that the present invention is not limited to the application of four valued case, but is applicable to the optional n valued case (n is a natural number more than 3). Since general digital circuits use binary notation, if the above n is a power of 2, the peripheral circuits can be constructed in a much simpler manner. When applied to the large n value, the number of latches must be increased from three to (n−1) pieces.

In the above explanation, the threshold values are appointed in the order from the lowest "11", "10", "00", to the highest of "01", but it is noted that the order and these values are only examples and not limited, and any values can be used if they are gray codes.

In the above embodiments, it has been assumed that the threshold value closer to the erasure level becomes lower than the other threshold values. It is a matter of course that the threshold value closer to the erasure level can be assigned a higher threshold value than the others.

In the above descriptions, the flash memory is explained as an example of the semiconductor memory devices. However, it can be applied to any semiconductor memory device if it is electrically writable, and a conventional EEPROM is one of the applicable examples.

The judgement operation in the step S16 to S18 shown in the flow-chart in FIG. 4 is not necessarily essential except in the product level, so that these steps can be omitted.

Figure 11:
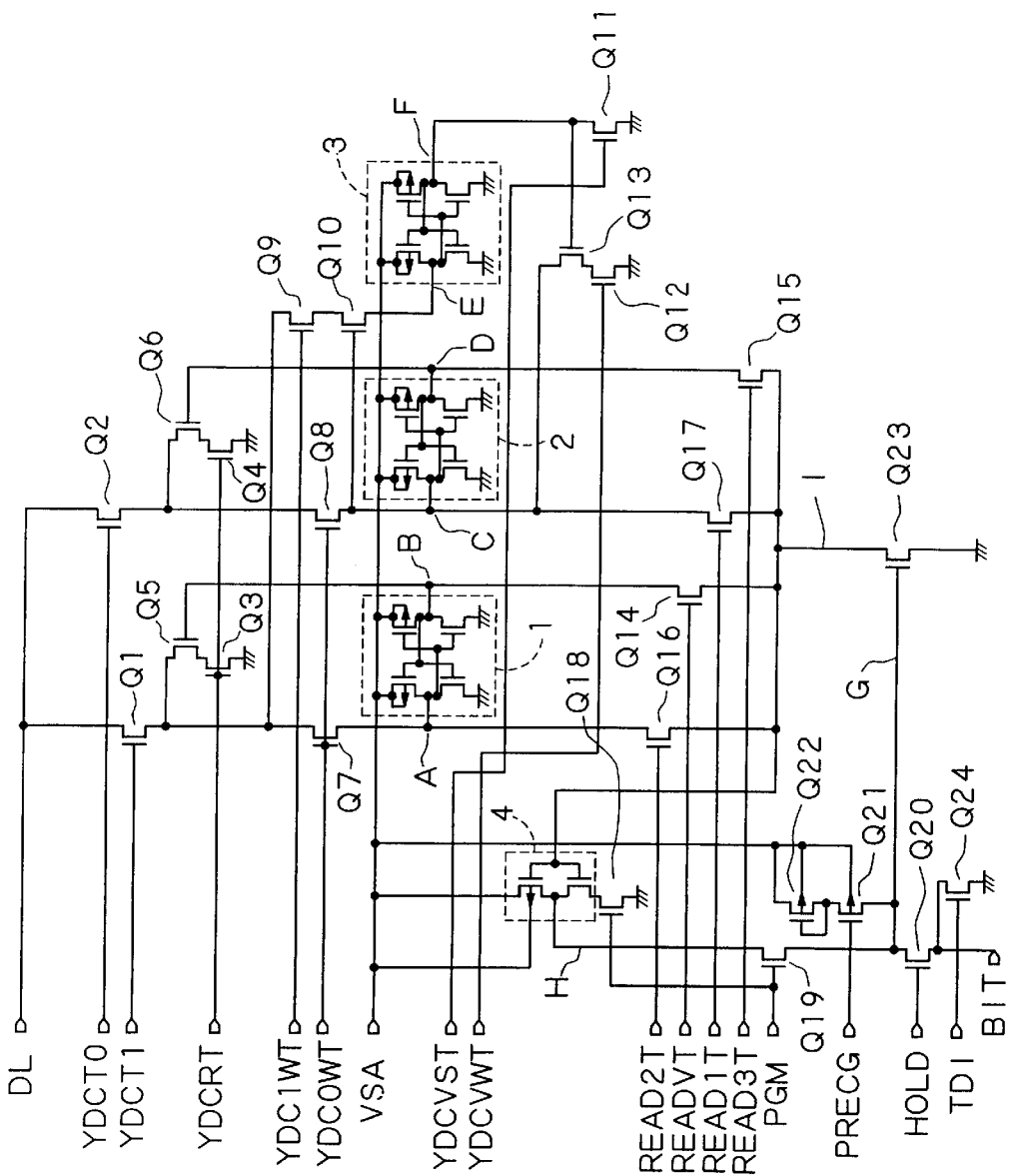
FIG. 11 is a diagram showing the detailed structure of the combination sense circuit and writing data latch when the data signals DL1 and DL2 shown in FIG. 1 are integrated into one data signal DL.

In the above explanation, the data carried by the data signals DL1 and DL2 are defined as the higher and lower rank bits, but the data signals DL1 and DL2 can be reversed for carrying the lower and higher rank bits. As shown in FIG. 11, it is also possible to integrate two data signals DL1 and DL2 into one data signal DL and the data can be input and output by switching the data signal DL and transistors TrQ1 and TrQ2 by time sharing.

As shown above, the present invention executes a writing operation until reaching the threshold value corresponding to the writing data by providing a plurality of latching devices of the same number of the threshold values, while setting and referring to a latching device in accordance to the writing data having multi-values. Thereby, in the writing operation, it becomes possible to dramatically reduce the total writing time by reducing the time for the unnecessary writing operation from the memory cell. In addition, since the complicated control for reading can be reduced during the writing operation, it is possible to simplify the circuit.

What is claimed is:

1. A nonvolatile semiconductor device, provided with a plurality of memory cells which store a multi-valued data having more than two values, comprising:

a plurality of latches provided in a number equal to a number of threshold values set for identifying each data of said multi-valued data stored in said memory cell; and a writing device for writing into said memory cells until reaching a threshold value corresponding to writing data, while setting and referring to the data stored in said plurality of latches corresponding to the multi-valued data, wherein each data of said multi-valued data, which is identified by said each threshold value, is constructed by gray code.

2. A nonvolatile semiconductor device according to claim 1, wherein said latches comprise three latches, each latch being provided with a different number from four valued data represented by two bits, each number being one of said threshold values, wherein the writing device executes the writing operation by:

(1) setting initially a first and a second latch from said three latches with each bit of said writing data and initializing a third latch of said three latches to the writing permission data or the writing prohibition data in accordance with said writing data;

(2) resetting said second latch to the writing permission data in advance, if the data stored in said third latch is the writing permission data, before respective writing stages for executing writing operations up to a first to a third of said threshold values;

(3) setting the writing prohibition data in the second latch after writing data from the ensure level of the memory cell to said first threshold value when the data of the second latch is the writing permission data;

(4) setting the writing prohibition data in said first latch after writing from the first threshold value to the second threshold value when the writing permission data is latched in said first latch; and (5) setting the writing prohibition data in said latch by writing from the second threshold value to the third threshold value when the writing permission data is written in said second latch.

3. A nonvolatile semiconductor device according to claim 1, wherein said writing device executes the writing operation from the threshold value closest to the erasure level of the memory cells at the time of erasing said memory cells towards the remotest threshold values in sequence.

4. A nonvolatile semiconductor device according to claim 1, wherein said plurality of latches and said writing device are provided in the circuit comprising a sense amplifier and a writing amplifier.

5. A nonvolatile semiconductor device according to claim 1, wherein, among said plurality of latches, the data read from said memory cells is taken into the latch in which said writing data is initially set at the time of writing in said memory cells.

6. A nonvolatile semiconductor device according to claim 1, wherein said writing device executes a verification operation for verifying whether or not the threshold value to be written is reached each time of the writing operation occurs, and after repeating said writing operation and the said verification operation until the threshold value has been reached, setting the writing prohibition data in either one of the latches used for the writing operation or the verification operation.

* * * * *